United States Patent
Sovero et al.

(10) Patent No.: US 10,158,344 B2
(45) Date of Patent: Dec. 18, 2018

(54) TUNABLE BANDPASS FILTER

(71) Applicant: GM GLOBAL TECHNOLOGY OPERATIONS LLC, Detroit, MI (US)

(72) Inventors: Emilio A. Sovero, Thousand Oaks, CA (US); Jongchan Kang, Moorpark, CA (US); Mohiuddin Ahmed, Moorpark, CA (US); James Chingwei Li, Simi Valley, CA (US); Cynthia D. Baringer, Piedmont, CA (US); Yen-Cheng Kuan, Los Angeles, CA (US); Timothy J. Talty, Beverly Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 11 days.

(21) Appl. No.: 15/406,338

(22) Filed: Jan. 13, 2017

(65) Prior Publication Data
US 2018/0205367 A1    Jul. 19, 2018

(51) Int. Cl.
*H03H 11/12* (2006.01)
*H03J 3/18* (2006.01)
*H03J 3/20* (2006.01)

(52) U.S. Cl.
CPC ............ *H03H 11/1256* (2013.01); *H03J 3/18* (2013.01); *H03J 3/185* (2013.01); *H03J 3/20* (2013.01); *H03H 2210/012* (2013.01); *H03H 2210/028* (2013.01); *H03J 2200/33* (2013.01)

(58) Field of Classification Search
CPC ......... H03J 3/185; H03J 3/20; H03H 11/0405
USPC .............................................. 333/15; 334/15
See application file for complete search history.

(56) References Cited

U.S. PATENT DOCUMENTS

| | | | | |
|---|---|---|---|---|
| 7,461,285 | B2 * | 12/2008 | Nervegna | ................. G06F 1/04 331/176 |
| 2009/0253395 | A1 * | 10/2009 | Ikeda | ................. H03H 11/1252 455/193.1 |

OTHER PUBLICATIONS

Xu et. al., "0.8/2.2-GHz Programmable Active Bandpass Filters in InP/Si BiCMOS Technology", IEEE Transactions on Microwave Theory and Techniques, vol. 63, No. 4, Apr. 2015, pp. 1219-1227.*

* cited by examiner

*Primary Examiner* — Benny Lee
*Assistant Examiner* — Hafizur Rahman
(74) *Attorney, Agent, or Firm* — Lorenz & Kopf, LLP

(57) ABSTRACT

A single-chip tunable bandpass filter is provided having a bandpass filter circuit with all tuning components for the bandpass filter circuit formed on the single-chip to provide a programmed center frequency for the tunable bandpass filter. The bandpass filter circuit may include, but is not limited to, a plurality of serially coupled singe stage biquad filter circuits coupled to an input formed on the single-chip and configured to provide a bandpass filtered output signal to an output formed on the single-chip. The bandpass filtered output may be provided by an output buffer formed on the single-chip. The single-chip includes at least one tuning input to receive data for tuning stored in a data register formed on the single-chip. The data register provides control bits to the tuning components that include a programmable resistor responsive to the control bits to vary the programmable resistor to adjust programmed center frequency.

17 Claims, 7 Drawing Sheets

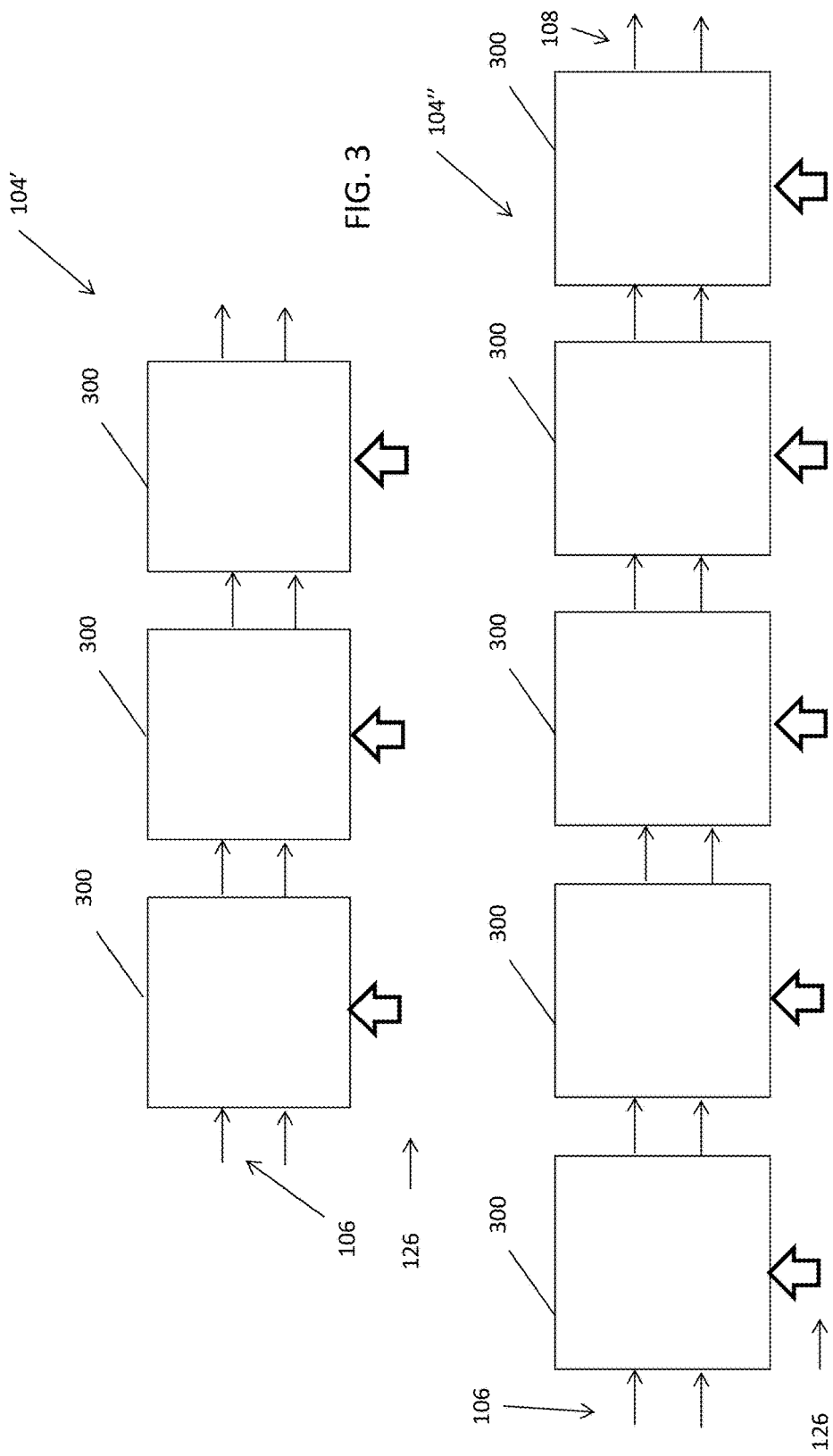

TUNABLE BANDPASS FILTER

INTRODUCTION

The present invention generally relates to tunable bandpass filters, and more particularly relates to a single-chip tunable bandpass filter having all tuning components on the single-chip.

Bandpass filters have a wide variety of uses in various signal processing applications. Tunable bandpass filters are those filters having adjustable center frequency they can be selected by adjusting various tuning components (e.g., resistors and capacitors). In some applications, active bandpass filters are formed on integrated circuits, however, it is common for some or all of the tuning components to be located off-chip. As will be appreciated, off-chip tuning components generally increase the physical size of the tunable bandpass filter and may degrade performance at higher frequencies.

Accordingly, it is desirable to provide a tunable bandpass filter having all tuning components located on a single chip with the bandpass filter circuit. In addition, it is desirable to provide a tunable bandpass filter that can be digitally tuned across a wide frequency range. Furthermore, other desirable features and characteristics of the present invention will become apparent from the subsequent detailed description of the invention and the appended claims, taken in conjunction with the accompanying drawings and the background of the invention.

SUMMARY

A single-chip tunable bandpass filter is provided having a bandpass filter circuit formed on the single-chip with all tuning componets for the bandpass filter circuit formed on the single-chip to provide a programmed center frequency for the tunable bandpass filter. The bandpass filter circuit may include, but is not limited to, a plurality of serially coupled singe stage biquad filter circuits to provide a third order or fifth order filter. The bandpass filter is coupled to an input formed on the single-chip and configured to provide a bandpass filtered output signal to an output formed on the single-chip. The bandpass filtered output may be provided by an output buffer formed on the single-chip. The single-chip includes at least one tuning input to receive data for tuning the all tuning components. The tuning data may be received in a serial programming interface and stored in a data register formed on the single-chip. The data register provides control bits to the all tuning components that includes, but is not limited to a programmable resistor responsive to the control bits to vary the programmable resistor, and thus, the programmed center frequency. The all tuning components may also include, but is not limited to, a voltage variable capacitor responsive to a voltage input on the single-chip to adjust the programmed center frequency.

A method is provided for programming a center frequency of a single-chip tunable bandpass filter having all tuning components located on the single-chip. The method includes receiving tuning data and storing the tuning data in a data register. Control bits from the data register are provided to the tuning components with includes, but is not limited to, a programmable resistor responsive to the control bits to vary a resistance value of the programmable resistor to program the center frequency.

BRIEF DESCRIPTION OF THE DRAWINGS

The present invention will hereinafter be described in conjunction with the following drawing figures, wherein like numerals denote like elements.

FIG. 3 is a block diagram of a third order bandpass filter circuit for the single-chip tunable bandpass filter of FIG. 1 or FIG. 2;

FIG. 4 is a block diagram of a fifth order bandpass filter circuit for the single-chip tunable bandpass filter of FIG. 1 or FIG. 2;

DETAILED DESCRIPTION

The following detailed description is merely exemplary in nature and is not intended to limit the invention or the application and uses of the invention. Furthermore, there is no intention to be bound by any theory presented in the preceding background or the following detailed description.

Figure 1:
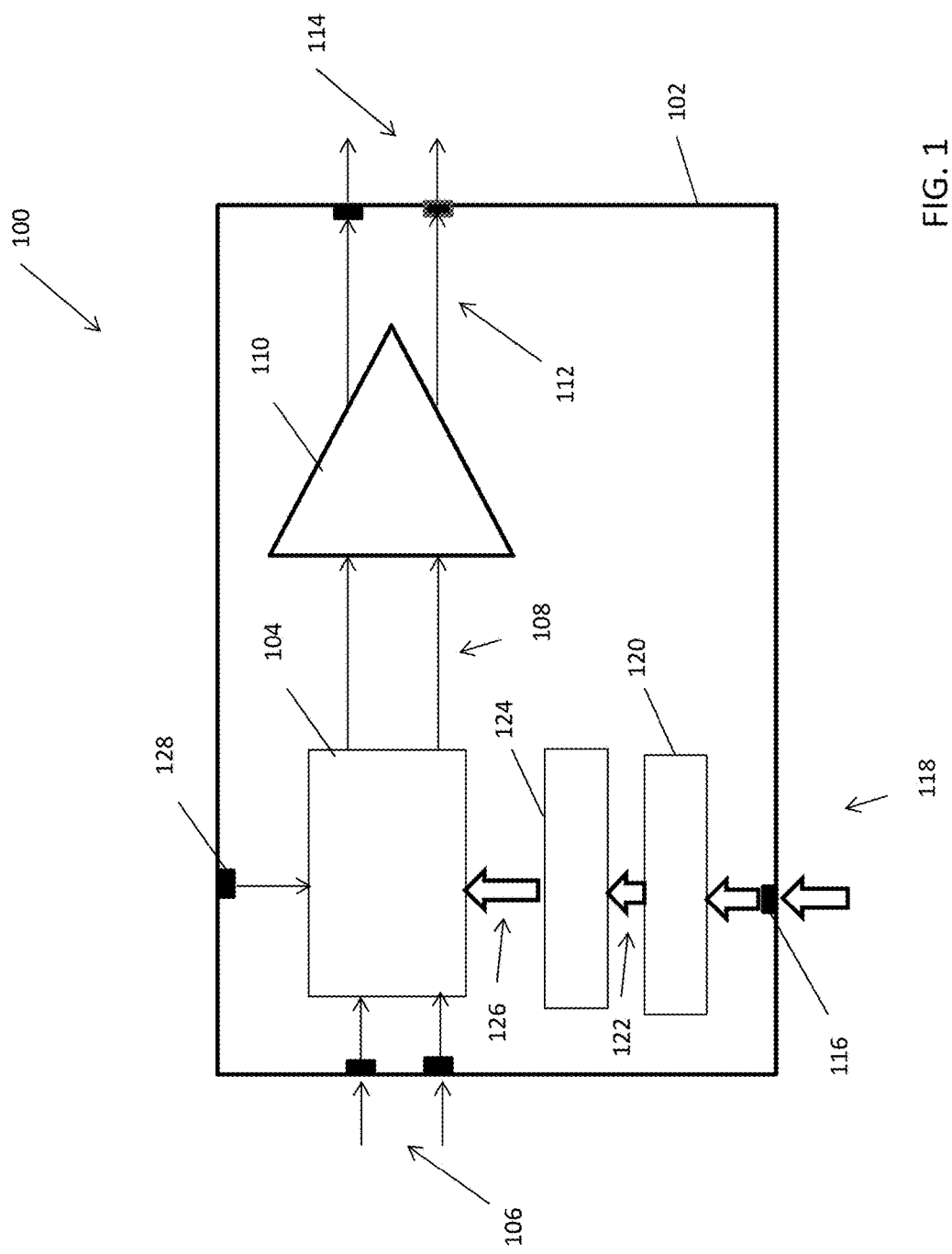
FIG. 1 is a block diagram of the single-chip tunable bandpass filter in accordance with exemplary embodiments of the present disclosure.

FIG. 1 illustrates a monolithic (single-chip) tunable active bandpass filter 100 in accordance with exemplary embodiments. The tunable active bandpass filter 100 of the present disclosure includes all tuning components resident on the single-ship filter die 102. As used herein, the phrase "all tuning components" means that all tuning components (e.g., resistors and capacitors) reside on the same filter die with the bandpass filter circuit and that no tuning components are located external (or off-chip) to the filter die 102.

The tunable active bandpass filter 100 includes a bandpass filter circuit 104 that receives an input signal to be filtered from an input 106 located on the filter die 102. In some embodiments, the input 106 comprises a differential input matched to 50 ohms, although other impedances may be matched in other implementations (e.g., 75 ohms). The bandpass filter output 108 from the bandpass filter circuit 104 is provided to an output buffer 110 to provide an filtered output signal 112 the appropriate drive levels to an output 114 located on the filter die 102. In some embodiments, the output buffer 110 has a unity gain, while another embodiments some application may be provided. According to exemplary embodiments, the bandpass filter circuit 104 may be realized as cascaded stages of a biquad active bandpass filter as will be discussed below. In some embodiments, the bandpass filter circuit 104 implements $3^{rd}$ order bandpass filter, while another embodiments a $5^{th}$ order filter is realized. It will be appreciated that the higher order filter will have a frequency response with a steeper slope than a lower order filter providing a more sharp or distinct bandpass filter.

The tunable active bandpass filter 100 includes a tuning input 116 on the filter die 102 that receives a serial programming interface (SPI) serial data stream 118. The tuning input 116 is coupled to an SPI interface 120 that converts the serial data stream 118 into tuning data 122 that are loaded into a data register 124. The tuning data in the data register 124 is provided as control bits 126 that are routed to the various stages of the bandpass filter circuit 104. The control bits 126 modify the on-chip tuning components of the bandpass filter circuit 104 to select the desired center frequency for the bandpass filter. In some embodiments, four control bits are selected to provide 16 different states for programming the center frequency of the bandpass filter circuit 104. In other embodiments, another tuning input 128 is provided on the filter die 102 that is coupled to another tuning element of the bandpass filter circuit 104. In some embodiments, the tuning input 128 comprises a voltage input that modifies the capacitance of a voltage variable capacitor configured as one of the on-chip tuning elements of the bandpass filter circuit 104 as will be discussed below.

Figure 2:
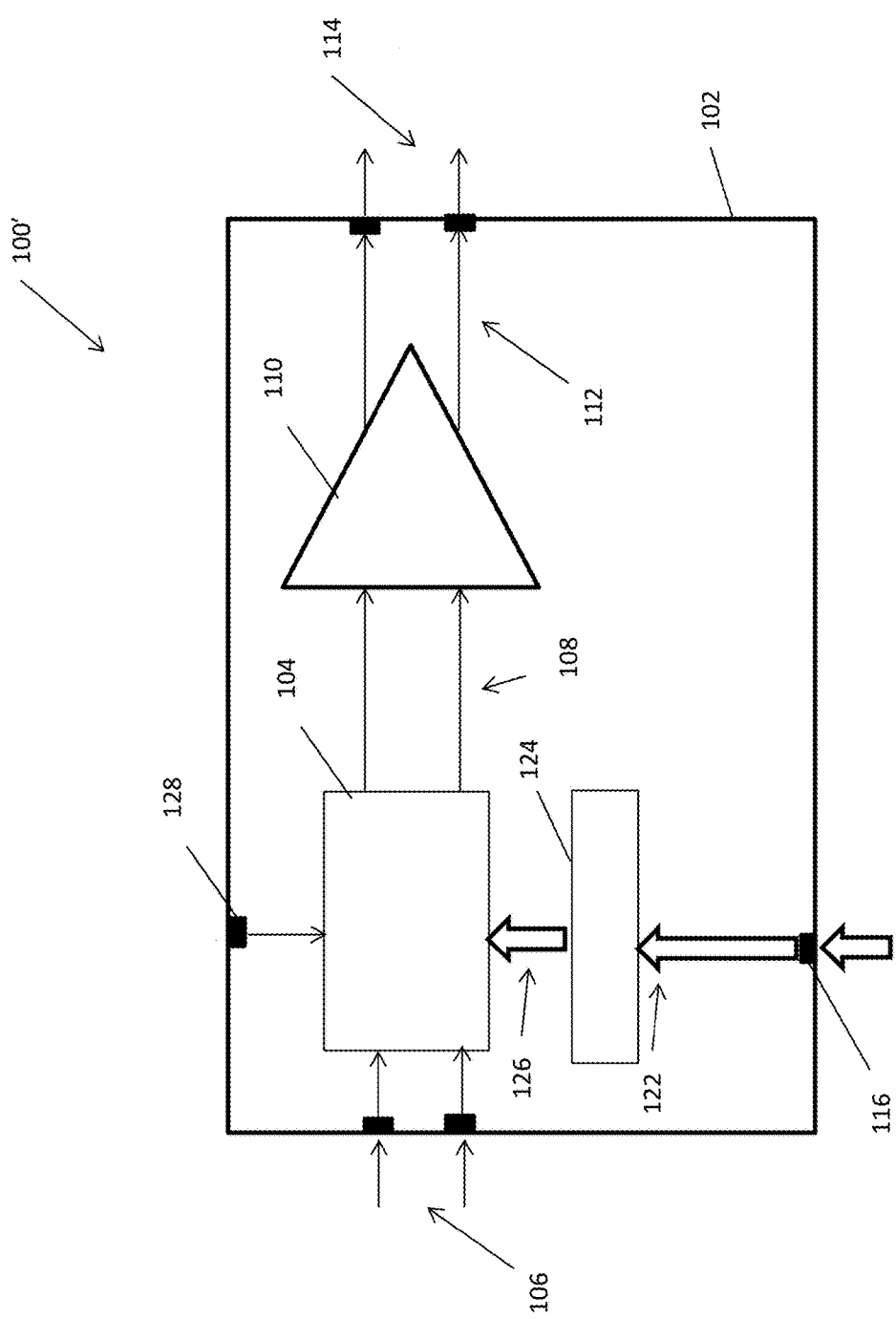
FIG. 2 is a block diagram of the single-chip tunable bandpass filter in accordance with exemplary embodiments of the present disclosure.

FIG. 2 illustrates another exemplary embodiment of the tunable bandpass filter 100' where like numbered components provide like functions as described above in connection with FIG. 1. In the embodiment of FIG. 2 the SPI interface 120 is not employed and the tunable bandpass filter 100' is programed directly by programming data 122 being provided to the data register 124.

With continued reference to FIG. 1 and FIG. 2, FIGS. 3-4 illustrate an exemplary filter circuits 104' and 104" formed of serially cascaded biquad bandpass filter circuits 300 to provide a 3rd order tunable bandpass filter circuit 104' and a $5^{th}$ order tunable bandpass filter circuit 104". In the $3^{rd}$ order exemplary embodiment 104', each stage 300 receives four control bits to program the on-chip tuning components of each stage to the desired center frequency. Accordingly, a 12 bit control word (containing control bits 0-11) of tuning data 126 is provided to the filter circuit 104' in FIG. 3. Similarly, a 20 bit control word (containing control bits 0-19) of tuning data 126 is provided to the filter circuit 104" in FIG. 4.

Figure 5:
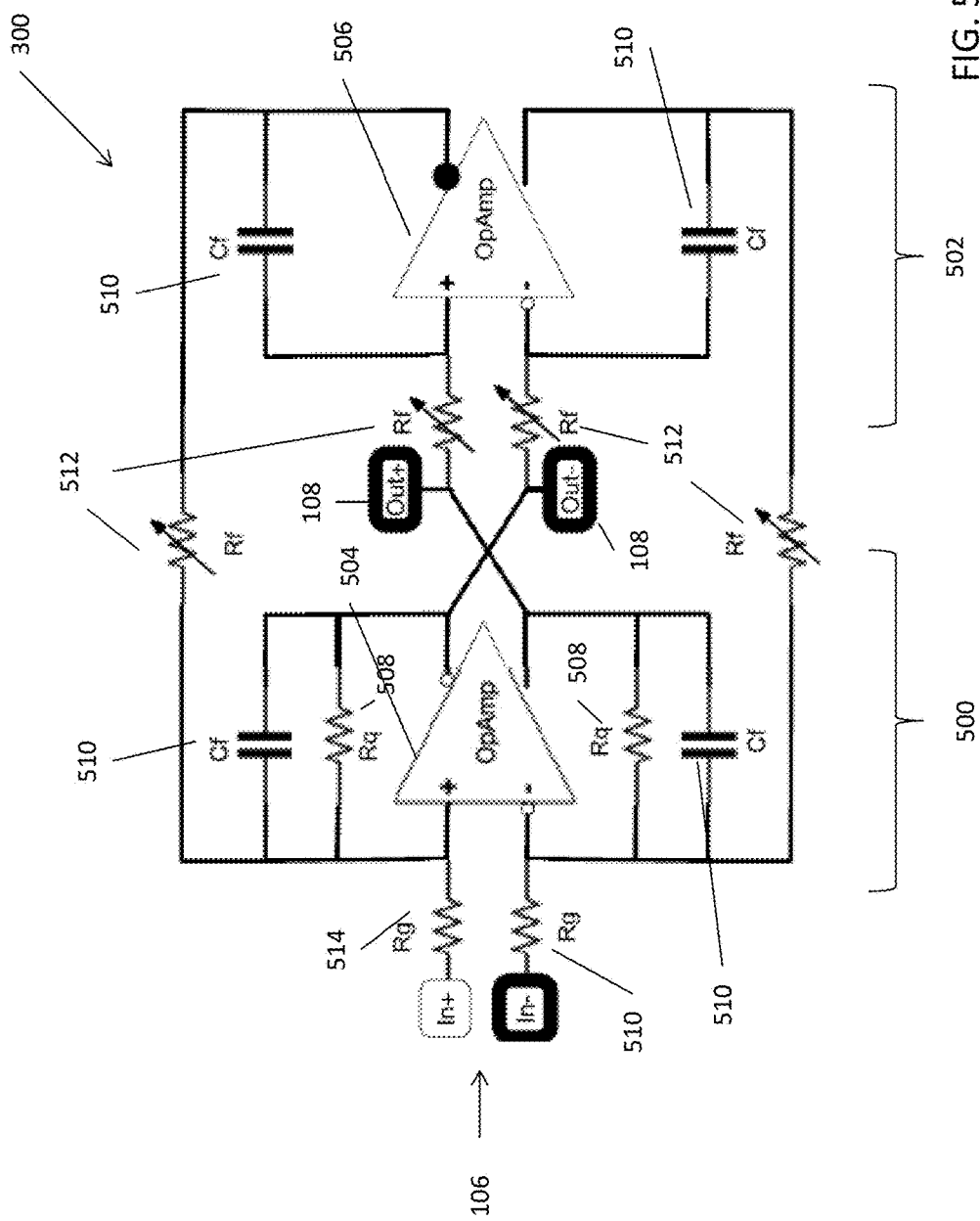
FIG. 5 is a schematic diagram of the single stage differential biquad filter of FIG. 3 or FIG. 4.

FIG. 5 is a circuit diagram of an exemplary single stage of a biquad bandpass filter 300 as illustrated in FIGS. 3-4. As will be appreciated, a biquad bandpass filter is a two pole filter created by a first stage 500 and a second stage 502 each employing an operational amplifier 504 and 506, respectively. In a fully differential implementation, each stage 500 and 502 have closed feedback loops from the non-inverting input to the inverting output of the operational amplifier 504, 506 and the inverting input to the non-inverting output of the operational amplifier 504, 506. In the first stage 500, the feedback loop is comprised of a resistor 508 and a capacitor 510. In the second stage 502, the capacitor 510 is employed in the feedback loop. Between the first stage 500 and the $2^{nd}$ stage 502, the non-inverting output of the operational amplifier 506 is fed back to the inverting input of the operational amplifier 504 through a tuning resistor 512. Similarly, resistor 512 is in the feedback loop from the inverting output of the operational amplifier 506 to the non-inverting input of operational amplifier 504. Operationally, the differential input signal 106 is resistively coupled via resistors 514 to the input of the first stage operational amplifier 504. The bandpass filter output 108 is taken from the differential output of the operational amplifier 504, which is coupled by a tuning resistor 512 to the second stage operational amplifier 506.

Figure 7:
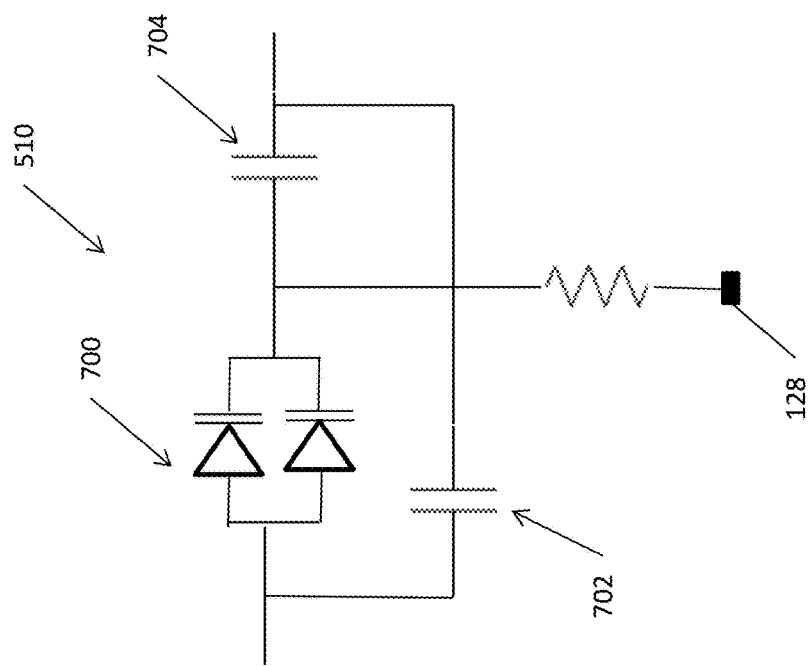
FIG. 7 is a schematic diagram of a voltage variable resistor of FIG. 5.
Figure 6:
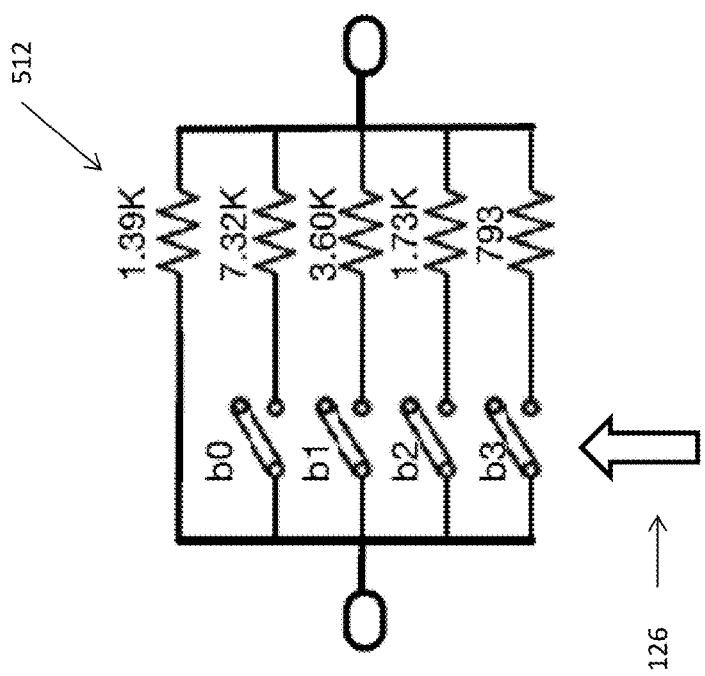
FIG. 6 is a schematic diagram of a programmable resistor circuit of FIG. 5.

As will be appreciated, the center frequency of the biquad filter circuit 300 is given by the equation: Center frequency=$1/2\pi C_f R_f$, where $R_f$ is the resistor 512 and $C_f$ is the capacitor 510. Accordingly, by varying the resistor 512 and\or the capacitor 510 the center frequency of the biquad filter circuit 300 may be adjusted. In accordance with some exemplary embodiments, the capacitor 510 is maintained at a constant value, while the resistor 512 is incrementally adjusted by using control bits from the data register 128 (see FIG. 1) as illustrated in FIG. 6. In other embodiments, the capacitor 510 is also variable as illustrated in FIG. 7. As illustrated in FIG. 7 varactors (variable reverse biased pn junctions) 700 are employed with capacitor 702 and 704 to create a voltage variable capacitor 510. By applying a voltage (e.g., 0 volts-4 volts) to voltage input 128 (see FIG. 1), the value of the capacitor 510 can be varied thereby adjusting the center frequency of the biquad filter circuit 300.

Figure 8:
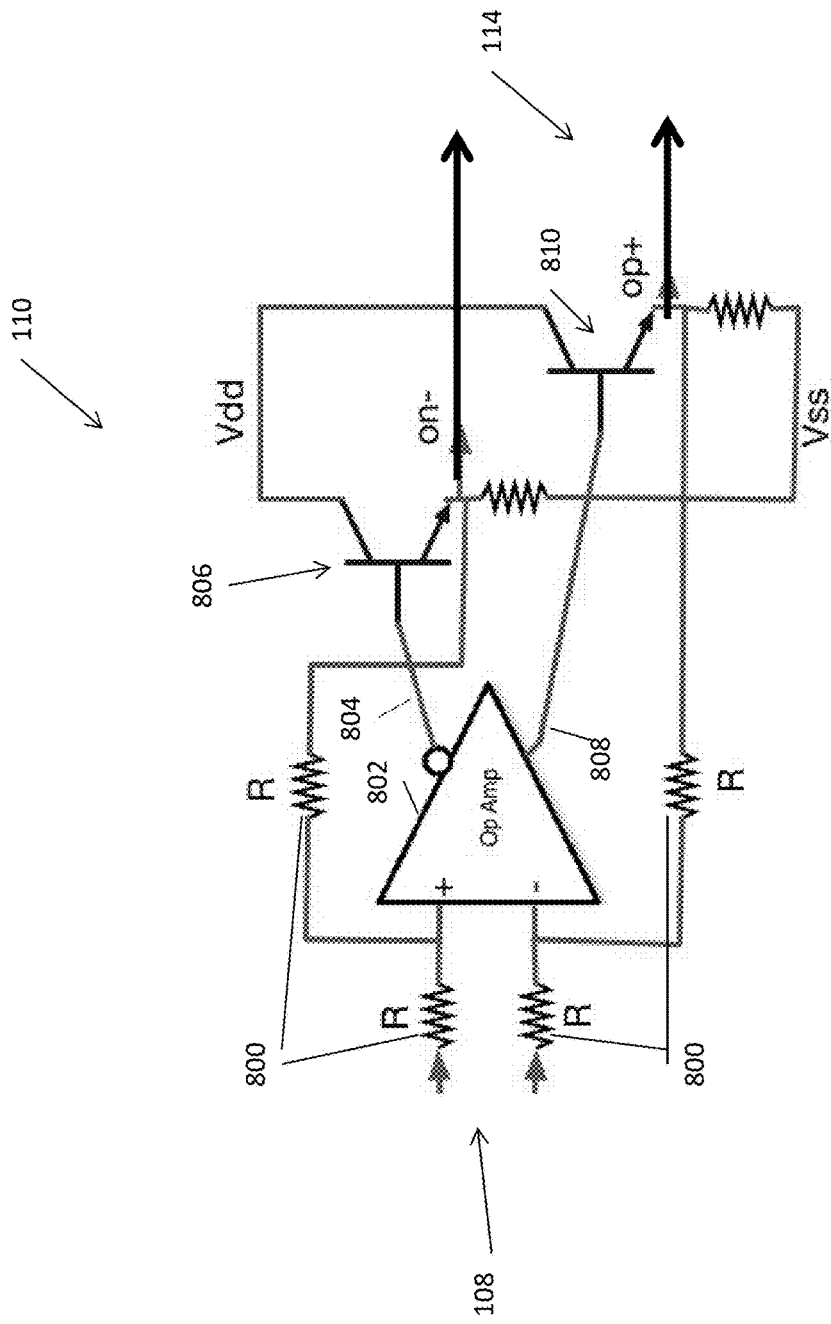
FIG. 8 is schematic diagram of an output buffer of FIG. 1 or FIG. 2.

FIG. 8 is a schematic diagram of the output buffer 110 (see FIG. 1). The output buffer 110 operates to increase the drive capability of the tunable bandpass filter to drive the low impedance (e.g., fifty ohm) load. As illustrated in FIG. 8, the differential output 108 from the bandpass filter circuit 104 is resistively coupled by resistor 800 an operational amplifier 802. The inverting output 804 of the operational and fire 802 is used to bias a drive transistor 806, while the non-inverting output 808 is used to bias drive transistor 810. The drive transistors 806 and 810 provide the buffer output signal 114 to the differential output of the filter by 102 (see FIG. 1).

Figure 9:
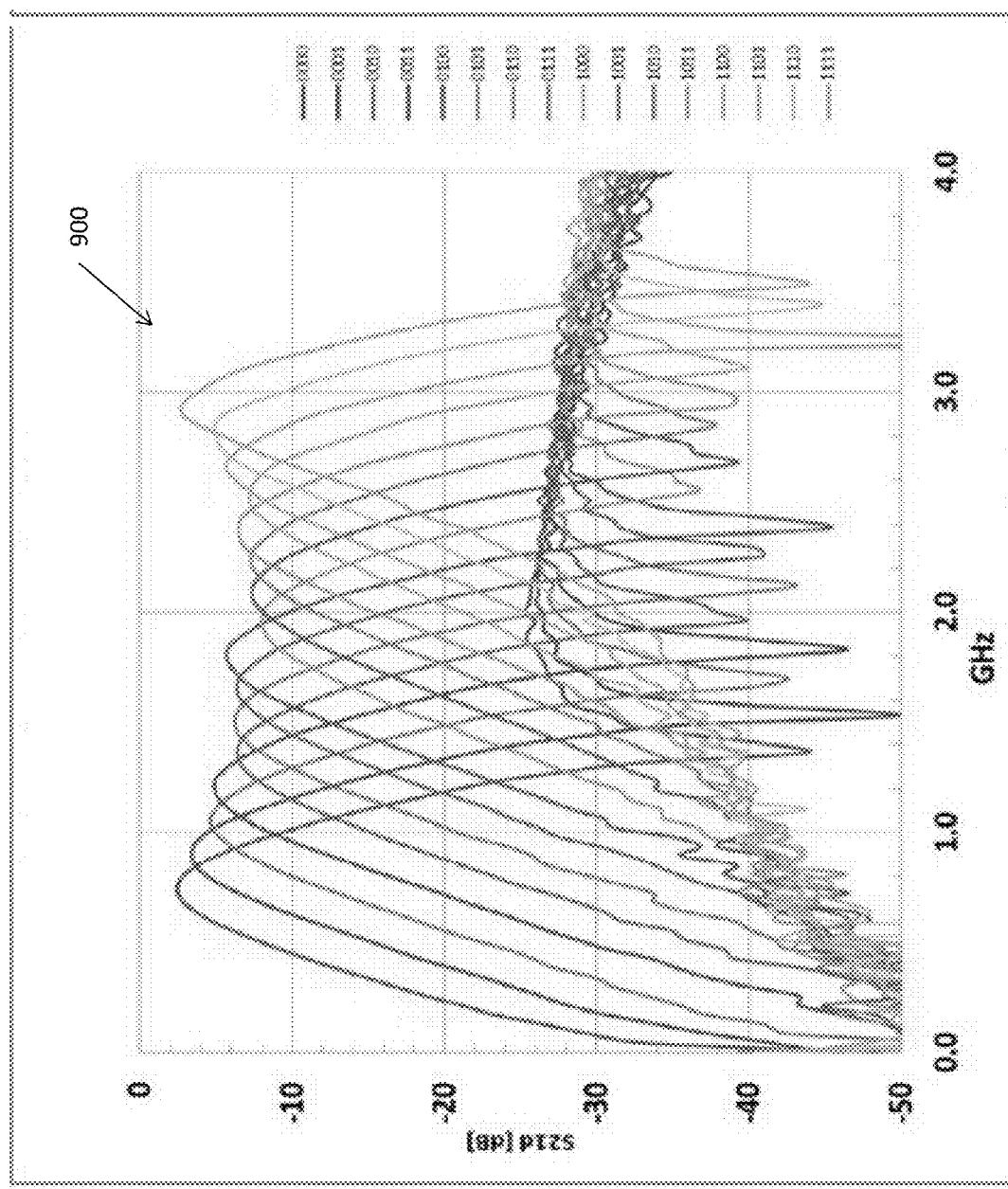
FIG. 9 is a chart illustrating actual measurements of the programmable frequency range of the center frequency of the single-chip tunable bandpass filter of FIG. 1 or FIG. 2 realized with the $3^{rd}$ order filter circuit of FIG. 3.

FIG. 9 is an illustration 900 of the tunable bandpass output provided by the tunable bandpass filter 100 (see FIG. 1). As discussed earlier, using four control bits 126 per filter stage (see FIGS. 3-4) from the data register 124, sixteen possible states of tuning resistor 512 (see FIG. 6) may be digitally programmed. FIG. 9 illustrates each of the 16 possible states (from left to right) providing a bandpass width of approximately 140 MHz over a tuning range of approximately 700 MHz to 3 GHz. Out of band signal rejection greater than 35 dB is achievable for a $3^{rd}$ order bandpass filter (see FIG. 3) and greater than 40 dB is achievable for a $5^{th}$ order bandpass filter (see FIG. 4) with all tuning components located on the single-chip tunable active bandpass filter 100.

As will be appreciated, while a $3^{rd}$ order (FIG. 3) and a $5^{th}$ order (FIG. 4) filter arrangement has been described for illustration of exemplary embodiments, any order filter can be created using the teachings of the present disclosure. The exemplary embodiments are non-limiting examples supporting the appended claims.

While at least one exemplary aspect has been presented in the foregoing detailed description of the invention, it should be appreciated that a vast number of variations exist. It should also be appreciated that the exemplary aspect or exemplary aspects are only examples, and are not intended to limit the scope, applicability, or configuration of the disclosure in any way. Rather, the foregoing detailed description will provide those skilled in the art with a convenient road map for implementing an exemplary aspect of the disclosure. It being understood that various changes may be made in the function and arrangement of elements described in an exemplary aspect without departing from the scope of the disclosure as set forth in the appended claims.

What is claimed is:

1. A single-chip tunable bandpass filter, comprising:
   a bandpass filter circuit formed on the single-chip, the bandpass filter circuit coupled to an input formed on the single-chip and configured to provide a bandpass filtered output signal to an output formed on the single-chip;
   all tuning components for the bandpass filter circuit including a programmable resistor circuit and a voltage variable capacitor formed on the single-chip; and
   at least one tuning input formed on the single-chip and coupled to the all tuning components for tuning the bandpass filter circuit to a programmed center frequency;

wherein, no tuning components are external to the single-chip for tuning the bandpass filter circuit to the programmed center frequency.

2. The single-chip tunable bandpass filter of claim 1, wherein the bandpass filter circuit comprises a biquad bandpass filter circuit formed on the single-chip via a biCMOS process.

3. The single-chip tunable bandpass filter of claim 1, further comprising an output buffer between the tunable bandpass filter circuit and the output formed on the single-chip.

4. The single-chip tunable bandpass filter of claim 1, wherein the bandpass filter circuit comprises a third-order biquad bandpass filter circuit or a fifth-order biquad bandpass filter circuit.

5. The single-chip tunable bandpass filter of claim 1, further comprising a data register formed on the single-chip positioned between the at least one tuning input and the programmable resistor circuit to provide tuning data stored in the data register to select the programmed center frequency.

6. The single-chip tunable bandpass filter of claim 5, further comprising a serial programming interface formed on the single-chip between the at least one tuning input and the data register and configured to convert a serial data stream into the tuning data stored in the data register to program the programmable resistor circuit to select the programmed center frequency.

7. The single-chip tunable bandpass filter of claim 1, wherein the input and output formed on the single-chip further comprise a differential input and a differential output, respectively, matched to fifty ohms.

8. The single-chip tunable bandpass filter of claim 1, wherein the at least one tuning input includes a voltage input coupled to the voltage variable capacitor to select the programmed center frequency.

9. A method of programming a center frequency of a single-chip tunable bandpass filter having all tuning components located on the single-chip, comprising:
receiving a serial data stream at a serial programming interface;
converting the serial data stream to tuning data and storing the tuning data in a data register; and
providing control bits from the data register to each of a plurality of serially coupled single stage biquad bandpass filter circuits to vary a respective programmable resistor located on the single-chip within each of the serially coupled single stage bi quad bandpass filter circuits thereby adjusting the center frequency of the single-chip tunable bandpass filter.

10. The method of claim 9, wherein four control bits are provided to each of the plurality of serially coupled single stage biquad bandpass filter circuits thereby providing sixteen programming states for the programmed center frequency of the single-chip tunable bandpass filter.

11. A single-chip tunable bandpass filter, comprising:
a plurality of single stage bi quad bandpass filter circuits serially coupled on the single-chip, the single-chip tunable bandpass filter coupled to a differential input formed on the single-chip and configured to provide a bandpass filtered differential output signal;
an output buffer configured on the single-chip to provide the bandpass filtered differential output signal to a differential output formed on the single-chip;
all tuning components for each of the plurality of single stage biquad bandpass filter circuits formed on the single-chip;
a tuning input formed on the single-chip and coupled to a data register providing tuning data stored in the data register to each of the plurality of single stage bi quad bandpass filter circuits for adjusting the corresponding all tuning components for tuning the single-chip tunable bandpass filter to a programmed center frequency; and
a serial programming interface formed on the single-chip between the tuning input and the data register and configured to convert a serial data stream into the tuning data stored in the data register to program a programmable resistor circuit to select the programmed center frequency;
wherein, no tuning components are external to the single-chip for tuning the single-chip tunable bandpass filter to the programmed center frequency.

12. The single-chip tunable bandpass filter of claim 11, wherein the plurality of single stage biquad bandpass filter circuits comprises three serially coupled single stage biquad bandpass filter circuits forming a third order bandpass filter.

13. The single-chip tunable bandpass filter of claim 11, wherein the plurality of single stage biquad bandpass filter circuits comprises five serially coupled single stage biquad bandpass filter circuits forming a fifth order bandpass filter.

14. The single-chip tunable bandpass filter of claim 11, wherein the differential input and differential output formed on the single-chip are each matched to fifty ohms.

15. The single-chip tunable bandpass filter of claim 11, wherein the tuning data comprises four control bits for each of the plurality of single stage biquad bandpass filter circuits thereby providing sixteen states for the programmed center frequency.

16. The single-chip tunable bandpass filter of claim 11, wherein the all tuning components further comprises a voltage variable capacitor coupled to a voltage input on the single-chip.

17. The single-chip tunable bandpass filter of claim 16, wherein the voltage input is coupled to the voltage variable capacitor to adjust the programmed center frequency.

* * * * *